United States Patent [19]

Chevallier

[11] Patent Number: 5,124,667
[45] Date of Patent: Jun. 23, 1992

[54] WIDEBAND AMPLIFIER HAVING SEPARATE OUTPUTS

[75] Inventor: Gilles Chevallier, Langrume/Mer, France

[73] Assignee: U.S. Philips Corporation, New York, N.Y.

[21] Appl. No.: 728,924

[22] Filed: Jul. 12, 1991

[30] Foreign Application Priority Data

Jul. 17, 1990 [FR] France ............................ 90 09084

[51] Int. Cl.$^5$ .................................................. H03F 1/34
[52] U.S. Cl. ....................................... 330/293; 330/290
[58] Field of Search ............... 330/293, 260, 146, 290; 358/184

[56] References Cited

U.S. PATENT DOCUMENTS

| | | | |
|---|---|---|---|
| 4,628,279 | 12/1986 | Nelson | 330/293 |
| 4,728,905 | 3/1988 | Zhiwei | 330/293 |
| 4,775,843 | 10/1988 | Wilcox | 330/293 |
| 4,885,548 | 12/1989 | Wakimoto et al. | 330/260 |
| 4,897,616 | 1/1990 | Wang et al. | 330/265 |

Primary Examiner—Eugene R. LaRoche
Assistant Examiner—Tan Dinh
Attorney, Agent, or Firm—Bernard Franzblau

[57] ABSTRACT

A wideband amplifier having a direct output (C) to which is connected a level shifting stage providing at least one level shifted output. A first transistor emitter follower ($Q_3$) is arranged in series with at least one level shifting element ($Q_4$). The first transistor ($Q_3$) has first resistor ($R_2$) disposed between its base and a supply voltage source ($V_{cc}$). A negative feedback circuit ($R_{F1}$) is coupled to at least one level shifted output. The level shifting stage also includes at least second and third transistors ($Q_{20}$, $Q_{30}$) whose bases are connected to one said level shifted output (S) and which are arranged so that their collectors form separate first and second outputs ($S_1$, $S_2$) respectively. A fourth emitter follower ($Q'_3$) is cascaded between the first emitter follower ($Q_3$) and the level shifting element ($Q_4$). A fifth transistor ($Q_{10}$) forms a current mirror circuit with said level shifting element and has its main current path connected in series between the main current path of the first emitter follower ($Q_3$) and a terminal of the level shifting element ($Q_4$) not connected to the fourth emitter follower ($Q'_3$).

16 Claims, 2 Drawing Sheets

WIDEBAND AMPLIFIER HAVING SEPARATE OUTPUTS

FIELD OF THE INVENTION

The present invention relates to a wideband amplifier having one direct output to which is connected a level shifting stage presenting at least one level shifted output and comprising at least a first transistor emitter follower arranged in series with at least one level shifting element, said first transistor having a first resistor disposed between its base and a supply voltage source, and a negative feedback circuit originating from at least one level shifted output.

An amplifier of this type is known from the article entitled "A 4-Terminal Wide-Band Monolithic Amplifier" by Robert G. Meyer and Robert A. Blauschild, published in IEEE Journal of Solid State Circuit Vol. SC 16, No. 6, Dec. 1981, pp. 634 to 638, more particularly, FIGS. 2 and 8.

BACKGROUND OF THE INVENTION

Such an amplifier is beneficial in having a wide passband as well as a low noise level and favourable values for the input and output impedances.

It is an object of the invention to improve the characteristic features of an amplifier that has separate outputs so that a considerable separation between the outputs is obtained, for example, for realising a mixer-separator which has a television output and a video recorder output.

SUMMARY OF THE INVENTION

The basic idea of the invention consists of using an amplifier of the aforementioned type which intrinsically has interesting characteristics, and improving the characteristics of the voltage shifting circuit of the main negative feedback loop so that a proper isolation is obtained between separate outputs which are connected thereto.

An amplifier according to the invention is thus characterized in that it comprises at least second and third transistors forming separate outputs, whose bases are connected to one said level shifted output and which are arranged so that their collectors form separate first and second outputs respectively, in that the level shifting stage comprises a fourth emitter follower cascaded between the first emitter follower and the level shifting element and in that it includes a fifth transistor forming a current mirror circuit with said level shifting element and whose main current path is connected in series between the main current path of the first emitter follower and a terminal of the level shifting element not connected to the fourth emitter follower.

The current mirror circuit permits diminishing the output impedance of the shifting circuit and improving the isolation between the separate outputs without augmenting the noise level.

According to an advantageous embodiment of the invention, the amplifier comprises a sixth transistor whose base constitutes an input of the amplifier and whose collector is connected to the base of a seventh transistor constituting a Darlington stage with an eighth transistor downstream in the circuit, said direct output being connected to the collector of the eighth transistor which is connected to the base of the first emitter follower.

Said negative feedback circuit may then comprise a second resistor connected between said level shifted output and the emitter of the sixth transistor which has a third emitter resistor. A fourth resistor may be inserted between the emitter of the eighth transistor and the base of the sixth transistor so as to form an auxiliary negative feedback circuit permitting defining the input impedance without introducing a low-value input resistor which would cause noise.

A current limitation in the main negative feedback loop may be obtained with a ninth transistor whose base is connected to said level shifted output and whose collector is connected through a fifth resistor to the base of a tenth transistor whose main current path is connected between said supply voltage source and, on the one hand, a fifth bias resistor of the collector of the sixth transistor and, on the other hand, the first resistor.

A shift of four base-emitter voltages may be obtained by cascading an eleventh emitter follower between the first and fourth emitter followers, a twelfth transistor forming a current mirror circuit with the level shifting element, its main current path being connected in series between the main current path of the eleventh transistor and the terminal of the level shifting element not connected to the fourth emitter follower.

A first current source may be connected to the terminal common to the fourth emitter follower and the level shifting element and at least one second current source may be connected to the base of at least one of the first and fourth transistors. At least one of said current sources may be constituted by a seventh resistor.

BRIEF DESCRIPTION OF THE DRAWINGS

The invention will be better understood with the aid of the following explanation given by way of non-limitative example with reference to the drawing Figures, wherein.

DESCRIPTION OF EMBODIMENTS

Figure 1:
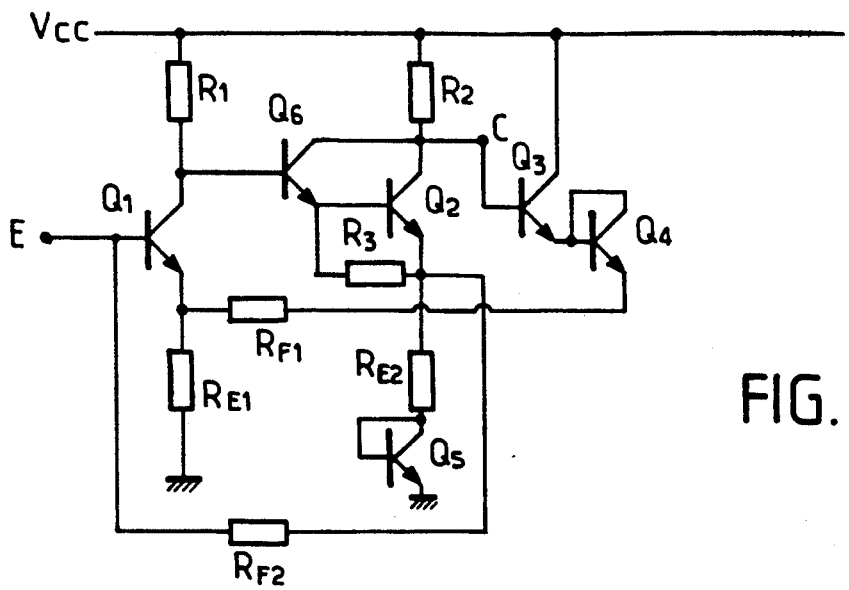
FIG. 1 shows an aforementioned prior-art amplifier.

As shown in FIG. 1, a wideband amplifier as described in the above publication by MEYER and BLAUSCHILD comprises a transistor $Q_1$, whose base constitutes the input E of the amplifier and whose collector, connected to a supply voltage source $V_{cc}$, is connected to the base of a transistor $Q_6$ constituting the upstream transistor of a Darlington stage having a downstream transistor $Q_2$. A resistor $R_3$ is connected between the emitters of the transistors $Q_2$ and $Q_6$. The interconnected collectors of the transistors $Q_2$ and $Q_6$ constitute a direct output C of the amplifier. A resistor $R_2$ may connect them to the supply voltage source $V_{cc}$. A main negative feedback loop which defines the gain of the amplifier comprises a two-level shifting circuit, that is to say, a first transistor $Q_3$ arranged as an emitter follower from output C, its collector being referenced to the supply voltage source $V_{cc}$ and cascaded with a diode $Q_4$ realised here as a transistor of the same type as $Q_3$ and whose base and collector are interconnected. A negative feedback resistor $R_{F1}$ is connected in series between the cathode (emitter) of the diode $Q_4$ and the emitter of the transistor $Q_1$, which is connected to the common mode pole (ground) through a resistor $R_{E1}$.

The gain of the amplifier thus has the following value:

$$\frac{R_{F1} + R_{E1}}{2 R_{E1}}$$

The Darlington stage provides a large open loop gain. An additional negative feedback loop which favourably influences the input and output impedances comprises a resistor $R_{F2}$ connected between the base of the transistor $Q_2$ and the base of the transistor $Q_1$ (input E). The resistor $R_{F2}$ makes it possible to apply a D.C. bias current to the base of transistor $Q_1$.

Such an amplifier, comprising a main negative feedback loop and an additional negative feedback loop as required, has a wide passband and a relatively low noise level and is therefore suitable for amplifying weak signals such as aerial signals.

Figure 2:
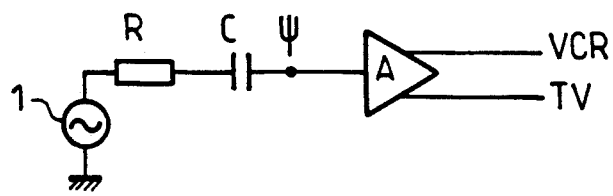
FIG. 2 shows a diagram of a mixer-separator for a television set.

FIG. 2 represents a diagram of a separator-mixer comprising an amplifier A receiving on its input aerial signals $\psi$ and having two separate outputs, one (TV) for feeding a television set and the other (VCR) for feeding a video recorder. These two outputs are to have a proper isolation with respect to each other and with respect to the aerial.

Figure 3:
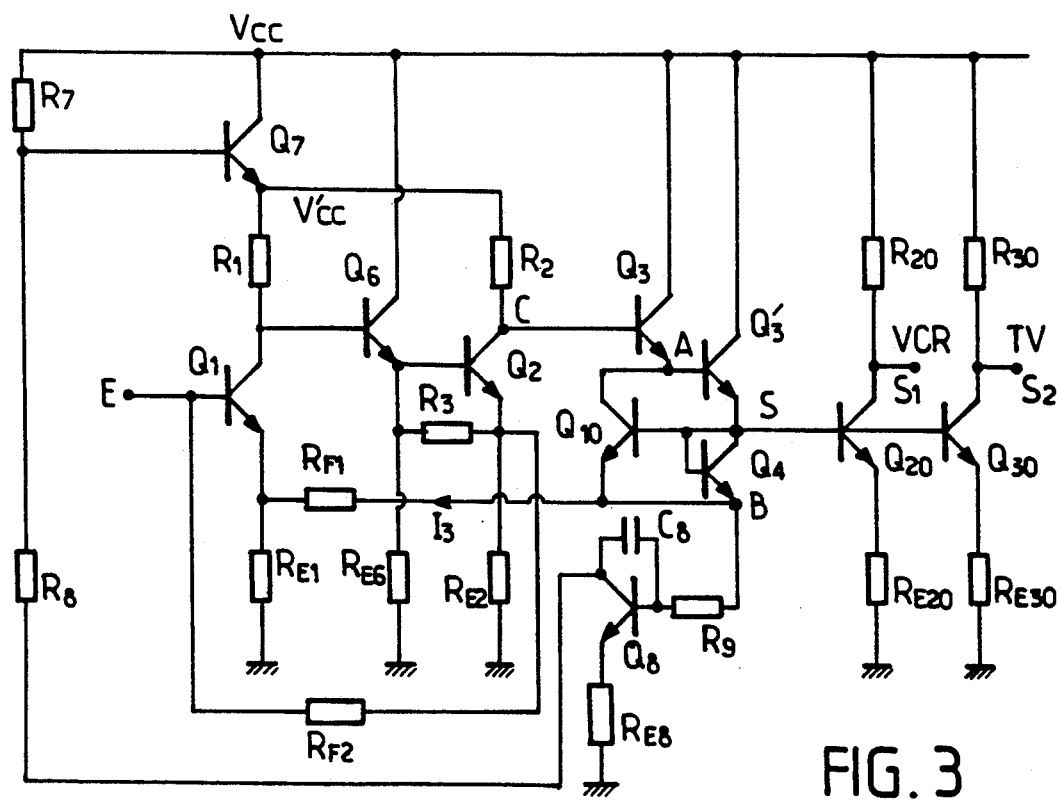
FIG. 3 shows an amplifier according to a preferred embodiment of the invention.

In FIG. 3 the elements performing like functions shown in FIG. 1 have like reference characters. The output shifting circuit has three levels for shifting with three base-emitter voltages, two transistors $Q_3$ and $Q'_3$ being cascaded as emitter followers with a transistor $Q_4$ arranged as a diode. The emitter of the transistor $Q'_3$ constitutes an output S whose level is shifted by two base-emitter voltages, and from which two separate output signals $S_1$ and $S_2$ are obtained in the following manner. Two transistors $Q_{20}$ and $Q_{30}$ have their collectors connected to the supply voltage source $V_{cc}$ through the respective resistors $R_{20}$ and $R_{30}$, their emitters connected to the common mode pole through the respective resistors $R_{E20}$ and $R_{E30}$ and their bases connected to the output S. The collectors of the transistors $Q_{20}$ and $Q_{30}$ constitute the respective separate outputs $S_1$ (for example, VCR output) and $S_2$ (for example, TV output).

The isolation between the outputs $S_1$ and $S_2$ and the amplifier input or between themselves is not perfect. At high frequencies the collector-base capacitance of the transistors $Q_{20}$ and $Q_{30}$ results in part of the signals on output S being reinjected and signals from one output being reinjected into the other.

As observed above, for improving this isolation it is desirable to diminish the value of the output impedance of the voltage shifting circuit (point B) and also of point S and to augment the impedance of point A (base of transistor $Q'_3$). For this purpose, a transistor $Q_{10}$ has its base connected to point S and its main current path connected between the points A and B, that is to say, in a series combination with the main current path of the transistor $Q_3$. If the transistors $Q_4$ and $Q_{10}$ are identical, the output current $I_3$ is uniformly divided between the transistors $Q_{10}$ and $Q_4$.

Let us assume that $Z_{B1}$ and $Z_{S1}$ are the output impedances at points B and S respectively, without transistor $Q_{10}$, and $Z_{B2}$ and $Z_{S2}$ the output impedances at points B and S respectively, with transistor $Q_{10}$.

Let us assume that $Z_{A1}$ is the input impedance at point A without transistor $Q_{10}$ and $Z_{A2}$ is the input impedance at point A with transistor $Q_{10}$. We then have:

$$Z_{B1} \simeq \frac{R_2}{\beta} + 3r_d \quad Z_{B2} \simeq \frac{R_2}{2\beta} + 3r_d$$

$$Z_{S1} \simeq \frac{R_2}{\beta} + 2r_d \quad Z_{S2} \simeq 2r_d$$

$$Z_{A1} \simeq R_{F1} + 2r_d \quad Z_{A2} \simeq 2(R_{F1} + 2r_d)$$

when $r_d$ = emitter resistance of a transistor
$\beta$ = current gain of transistor $Q_3$.

The level shifting (three base-emitter voltages of a transistor) remains substantially identical (less than 18 mV).

The transistor $Q_3$ (passed through by a current $I/2$) is fed by the transistor $Q_{10}$.

For optimization of the circuit the dynamic resistances of the diodes are to be very low relative to the value of $R_{F1}$. This condition can easily be fulfilled with the proposed circuit which augments neither the current consumption nor the noise level.

The addition of a transistor $Q_{10}$ provides an improvement of up to about 10 dB for the isolation between the input and output of the amplifier, that is to say, between the aerial and one of the outputs $S_1$, $S_2$ as well as between the two outputs.

By way of example the values of the components may be the following:

| | | |
|---|---|---|
| $R_1 = 500 \, \Omega$ | $R_2 = 50 \, \Omega$ | |
| $R_{F1} = 120 \, \Omega$ | $R_{F2} = 600 \, \Omega$ | |
| $R_{E1} = 15 \, \Omega$ | $R_{E2} = 80 \, \Omega$ | $R_{E6} = 500 \, \Omega$ |

In the following it will be shown how to limit the current $I_3$ which passes through the main negative feedback resistor $R_{F1}$.

Let us assume that n is the number of levels of the voltage shifting circuit (for FIG. 3, n=3).

As a first approximation we have:

$$I_3 = \frac{V_{cc} - V_{BE}\left[\left(1 + \frac{R_2}{R_{E2}}\right) + n - 1\right]}{R_{F1} + R_{E1}\left(1 + \frac{R_2}{R_{E2}}\right)}$$

$I_3$ is very sensitive to variations of $V_{cc}$ and of the temperature.

In order that the negative feedback has a good linearity and a gain independent of the voltage shifting circuit, the resistor $R_{F1}$ is to have a value which is much higher than the output impedance $Z_{B2}$ of the voltage shifting circuit, that is:

$$R_{F1} >> \frac{R_2}{2\beta} + 3r_d$$

Because the value of $R_{F1}$ is selected to be a function of a certain number of parameters corresponding to the required performance of the arrangement and because $I_3$ is sensitive to variations of temperature and variations of the supply voltage, it is desirable to control its variations at least in the first instance so as to avoid a current consumption which is too high in extreme conditions.

In order to realise this, the basic idea is to provide that the voltage $V_3$ at point B in essence accounts for the current $I_3$. The current $I_3$ may be controlled by measuring the voltage $V_3$.

The base of a transistor $Q_8$ is connected to the point B through a resistor $R_9$ which has a high value, and its emitter is connected to a supply voltage source (ground) through a resistor $R_{E8}$. An integration capacitor $C_8$ is connected between its collector and its base. Its collector is connected through a resistor $R_8$ to the base of a ballast transistor $Q_7$ whose collector is connected to the supply voltage source $V_{cc}$, its emitter to a terminal of the resistors $R_1$ and $R_2$. A resistor $R_7$ is connected between the collector and the base of the transistor $Q_7$ so that it forms a divider bridge with the resistor $R_8$. The resistor $R_7$ is chosen so that it does not disturb the amplifier. The current passing through the resistor $R_7$ depends on the current $I_3$ and the voltage $V'_{cc}$ on the emitter of the transistor $Q_7$ tends to diminish when the current $I_3$ tends to augment, whence the obtained control because $I_3$ depends on $V'_{cc}$ instead of $V_{cc}$ with this configuration.

Figure 4:
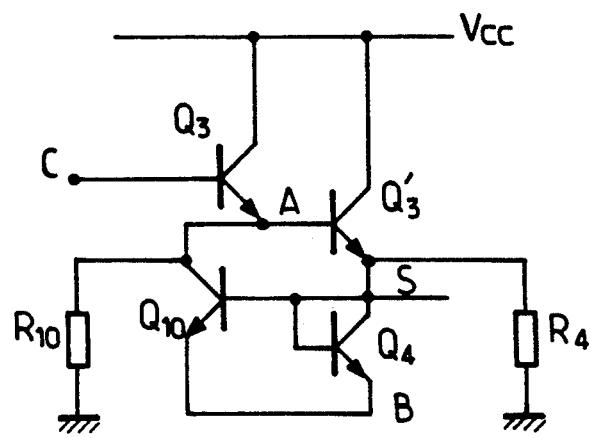
FIGS. 4 and 5 show two variants of the shifting circuit according to the invention.

FIG. 4 represents a structure in which the linearity of the voltage shifting circuit is improved by adding current sources at the points A and S, which sources are constituted by the respective resistors $R_{10}$ and $R_4$.

Figure 5:
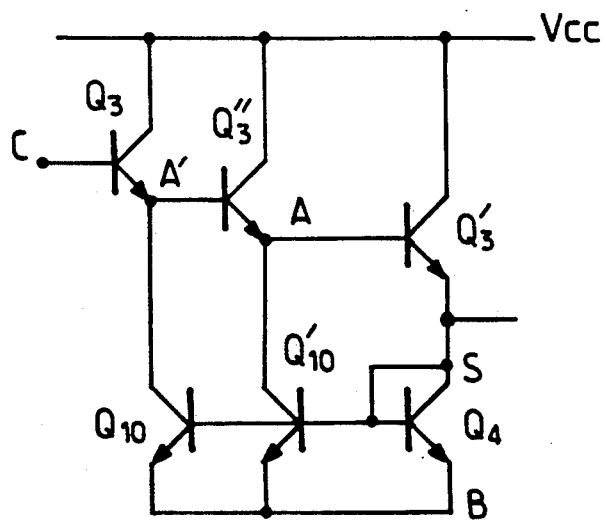

FIG. 5 represents an embodiment corresponding to the case where n=4. An emitter follower $Q''_3$ is cascaded in series between the transistors $Q_3$ and $Q'_3$ and the transistor $Q'_{10}$. The transistor $Q'_{10}$ forms a current mirror circuit with the diode $Q_4$ and has its main current path arranged in series with that of the transistor $Q''_3$. This configuration may permit diminishing $I_3$.

The invention is not restricted to the embodiments described and represented. In particular, the represented transistors are of the npn type, which lend themselves best to an integrated realisation because they are faster than their homologous pnp transistors with which an amplifier according to the invention also could be realised.

I claim:

1. A wideband amplifier having one direct output to which is connected a level shifting stage providing at least one level shifted output and comprising at least a first transistor emitter follower connected in series with at least one level shifting element, said first transistor having a first resistor coupled between its base and a supply voltage source, and a negative feedback circuit originating from at least one level shifted output, characterized in that at least second and third transistors have bases connected to one said level shifted output and are connected so that their collectors form separate first and second outputs, in that the level shifting stage comprises a fourth transistor emitter follower cascaded between the first emitter follower and the one level shifting element, and a fifth transistor connected to form a current mirror circuit with said one level shifting element and whose main current path is connected in series between a main current path of the first transistor emitter follower and a terminal of the one level shifting element not connected to the fourth transistor emitter follower.

2. An amplifier claimed in claim 1, characterized in that the level shifting element is a transistor realised by means of diodes.

3. An amplifier as claimed in claim 1 which further comprises a sixth transistor whose base constitutes an input of the amplifier and whose collector is connected to the base of a seventh transistor constituting a Darlington stage with an eighth transistor downstream in the circuit, said direct output being connected to a collector of the eighth transistor which is connected to the base of the first transistor emitter follower.

4. An amplifier as claimed in claim 3, characterized in that said negative feedback circuit comprises a second resistor connected between said level shifted output and an emitter of the sixth transistor, and means connecting a third resistor to said emitter of the sixth transistor.

5. An amplifier as claimed in claim 4 which further comprises a fourth resistor coupled between an emitter of the eighth transistor and the base of the sixth transistor.

6. An amplifier as claimed in claim 5 which further comprises a ninth transistor whose base is connected to said level shifted output and whose collector is connected through a fifth resistor to a base of a tenth transistor whose main current path is connected between said supply voltage source and a sixth bias resistor in the collector circuit of the sixth transistor and, on the other hand, the first resistor.

7. An amplifier as claimed in claim 1 wherein the level shifting stage comprises a sixth transistor emitter follower cascaded between the first and fourth transistor emitter followers and a seventh transistor forming a current mirror circuit with the one level shifting element and with its main current path connected in series between a main current path of the sixth transistor and the terminal of the one level shifting element not connected to the fourth transistor emitter follower.

8. An amplifier as claimed in claim 7, characterized in that it comprises a first current source connected to a common terminal (S) of the fourth transistor emitter follower and the one level shifting element and at least one second current source connected to the base of at least one of the first and fourth emitter followers ($Q_3$, $Q'_3$).

9. An amplifier claimed in claim 8, wherein at least one of said current sources comprises a second resistor.

10. An amplifier as claimed in claim 2 which further comprises a sixth transistor whose base constitutes an input of the amplifier and whose collector is connected to the base of a seventh transistor constituting a Darlington stage with an eighth transistor downstream in the circuit, said direct output being connected to a collector of the eighth transistor which is connected to the base of the first transistor emitter follower.

11. An amplifier as claimed in claim 10, characterized in that said negative feedback circuit comprises a second resistor connected between said level shifted output and an emitter of the sixth transistor, and means connecting a third resistor to said emitter of the sixth transistor.

12. An amplifier as claimed in claim 11 which further comprises a fourth resistor coupled between an emitter of the eighth transistor and the base of the sixth transistor.

13. An amplifier as claimed in claim 3 which further comprises a second resistor coupled between an emitter of the eighth transistor and the base of the sixth transistor.

14. An amplifier as claimed in claim 3 which further comprises a ninth transistor whose base is connected to said level shifted output and whose collector is connected through a second resistor to a base of a tenth transistor whose main current path is connected between said supply voltage source and a third bias resistor in the collector circuit of the sixth transistor and, on the other hand, the first resistor ($R_2$).

15. An amplifier as claimed in claim 4 wherein the level shifting stage comprises a ninth transistor emitter follower cascaded between the first and fourth transistor emitter followers and a tenth transistor forming a current mirror circuit with the one level shifting element and with its main current path connected in series between a main current path of the ninth transistor and the terminal of the one level shifting element not connected to the fourth transistor emitter follower.

16. An amplifier as claimed in claim 15, characterized in that it comprises a first current source connected to a common terminal of the fourth transistor emitter follower and the one level shifting element and at least one second current source connected to the base of at least one of the first and fourth transistor emitter followers.

* * * * *